United States Patent [19]

Akiyama

[11] Patent Number: 5,271,015
[45] Date of Patent: Dec. 14, 1993

[54] SELF-DIAGNOSTIC SYSTEM FOR SEMICONDUCTOR MEMORY
[75] Inventor: Tsutomu Akiyama, Tokyo, Japan
[73] Assignee: Ando Electric Co., Ltd., Tokyo, Japan
[21] Appl. No.: 783,646
[22] Filed: Oct. 28, 1991
[30] Foreign Application Priority Data
Nov. 14, 1990 [JP] Japan .................................. 2-307640
[51] Int. Cl.$^5$ .............................................. G11C 29/00
[52] U.S. Cl. ................................... 371/21.5; 371/25.1
[58] Field of Search .......................... 371/21.5, 25.1, 61, 371/9.1, 21.1, 21.2; 365/201

[56] References Cited
U.S. PATENT DOCUMENTS

| 4,423,508 | 12/1983 | Shiozaki et al. | 371/19 |
| 4,916,696 | 4/1990 | Funakubo | 371/9.1 |
| 4,972,418 | 11/1990 | Chou | 371/21.5 |
| 5,012,423 | 4/1991 | Bailey et al. | 371/16.3 |

FOREIGN PATENT DOCUMENTS 0048210 10/1982 Japan .................................. 371/21.5

Primary Examiner—Robert W. Beausoliel, Jr.
Assistant Examiner—Phung M. Chung
Attorney, Agent, or Firm—Seidel, Gonda, Lavorgna & Monaco

[57] ABSTRACT

A self-diagnostic memory checking system includes a data generator for generating and applying data to a selected address of a memory when a CPU is in a memory write mode and generating expected data when the CPU is in a memory read mode. An address generator provides a memory address for the memory. The data is read out of the memory during the memory read mode and is compared to the expected data for detecting errors in the memory. In order to allow memory checking to proceed without constant action by software in the CPU, a range of memory addresses to be tested are loaded into a test finish detector. A separate clock generator provides enabling timing clock pulses to the address generator, data generator and memory in response to a test start signal from the CPU. A switch circuit connects data from the data generator to a first output connected to the data input of the memory when the CPU is in the memory write mode and to a second output when the CPU is the memory read mode. A comparator connected to the output of the memory for comparing the data read from the memory and to the expected data from the second output of the switch circuit gives an output representative of whether the expected data and the data read from the memory are in coincidence. A flip-flop receives the output of the comparator and indicates the result of the comparison.

1 Claim, 5 Drawing Sheets

SELF-DIAGNOSTIC SYSTEM FOR SEMICONDUCTOR MEMORY

BACKGROUND OF THE INVENTION

This invention relates to a self-diagnostic system for semiconductor memory to be used with a random logic IC tester loaded with an IC test pattern memory or with an IC tester loaded with a multibit, large-capacity memory.

The construction of a conventional semiconductor memory diagnostic system is illustrated in FIG. 6. Referring to FIG. 6, the numeral 1 designates a CPU; 2, a data generator; 3, an address generator; 4, a comparator; and 5, a memory as a subject of diagnosis.

In FIG. 6, a diagnostic sequence program is written in the CPU 1 and, in a memory write mode, an address desired to be written into the memory 5 is given by the CPU 1 to the address generator 3. The address generator 3 receives the given address and adds it to the address input of the memory 5. The data generator 2 is supplied with data from the CPU 1 to be given to the memory 5. It receives the data and transfers it to the data input of the memory 5.

When a write signal is sent from the CPU 1 to the memory 5, the latter writes the data into the address it holds.

Next, in a memory read mode, the address to be read out from the memory is given by the CPU 1 to the address generator 3. The address generator 3 receives the address and transfers it as an address input to the memory 5. The memory reads the data at the address so added and sends the data to the comparator 4. The data generator 2 is supplied with expected data by the CPU 1. It receives the expected data and sends it to the comparator 4. The comparator 4 compares the output data from the memory 5 with the expected data, determines whether they are equal or in coincidence or not, and judges that the memory 5 is functioning properly or not.

In FIG. 6, a software is used to perform these actions with all the addresses in the memory 5.

Since the software controls the verification of operation of the memory 5, a long run time required is a problem.

SUMMARY OF THE INVENTION

The present invention aims at providing a self-diagnostic system for memory which comprises, in addition to the parts of the conventional system shown in FIG. 6, a clock generator, test finish detector, S.W. circuit, and flip-flop (hereinafter called "FF"), so that the diagnosis can be controlled by the hardware to shorten the diagnosis time.

To achieve the above aim, the system according to the invention comprises a CPU 1 in which a sequence program for diagnosis is written; a data generator 2 which generates data to be applied to a memory 5 when the CPU 1 is in the memory write mode and generates expected data when the CPU is in the memory read mode; an address generator 3 which gives an address to be written in the memory 5 to the address input of the memory when the CPU 1 is in the memory write mode and transfers an address read out from the memory 5 to the address input of the memory when the CPU is in the memory read mode; a clock generator 6 which is started with a test start signal 1c from the CPU 1; a test finish detector 7 which is operated with the output clock of the clock generator 6, detects the finish of a test with the address generator 3 that generates an address, and stops the operation of the clock generator 6; an S.W. circuit 8 which receives the output from the data generator 2 and, under the command of the CPU 1, transmits the data as the first output 8a to the data input of the memory 5, takes up expected data from the CPU 1 into the data generator 2, and changes the expected data to be the second output 8b; a comparator 4 which receives data read from the memory 5 as the first input and the second output 8b from the S.W. circuit 8 as the second input, compares the output data from the memory 5 with the expected data, detects whether the expected data and the output data from the memory 5 are in coincidence or not, and decides that the memory 5 is sound or erroneous; and an FF 9 which takes the output from the comparator 4 as a set signal and the test start signal 1c from the CPU 1 as a reset signal.

DESCRIPTION OF THE PREFERRED EMBODIMENTS

Figure 1:
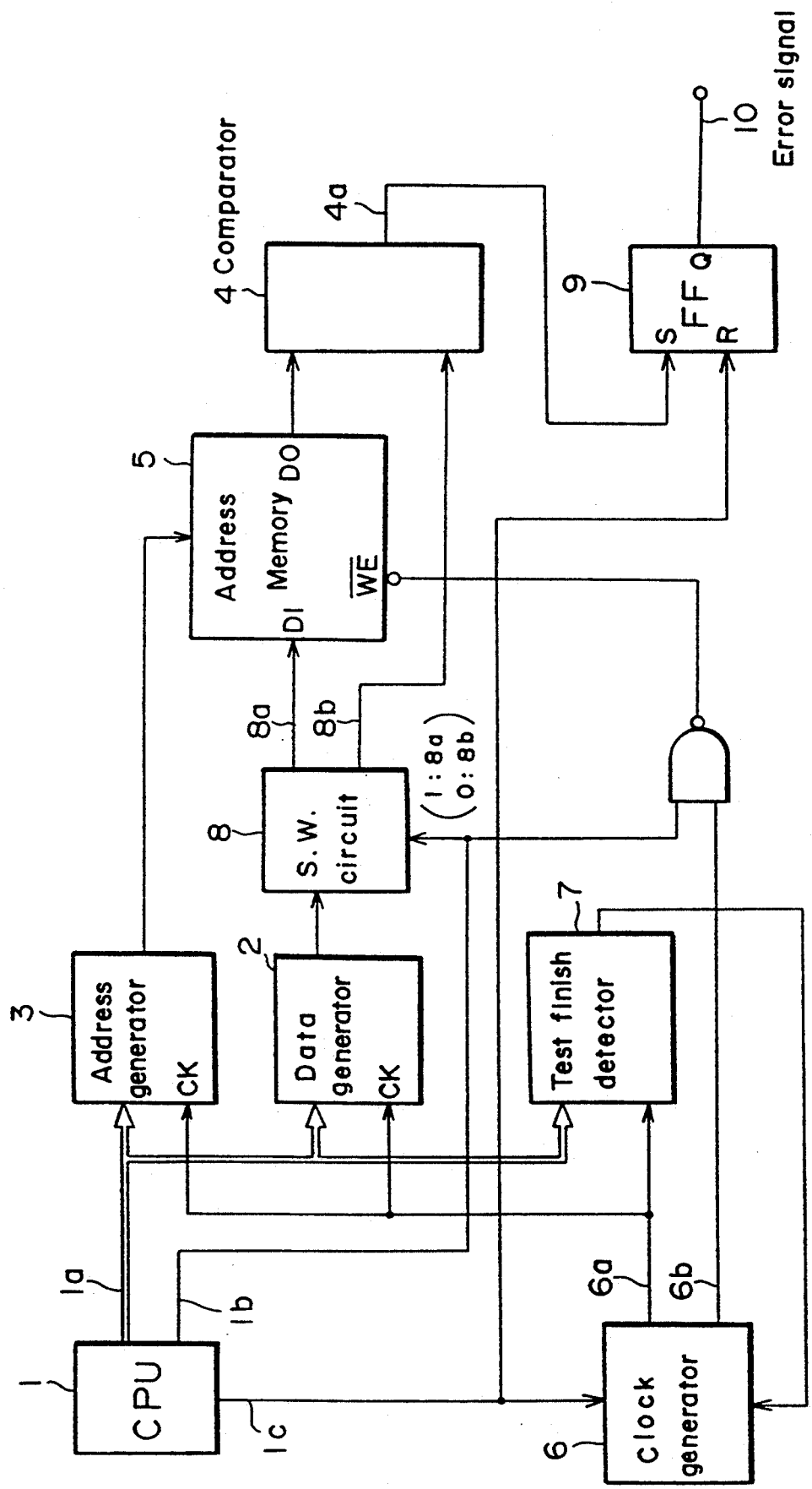
FIG. 1 is a flow diagram showing the construction of a self-diagnostic system for semiconductor memory embodying the present invention.
Figure 6:
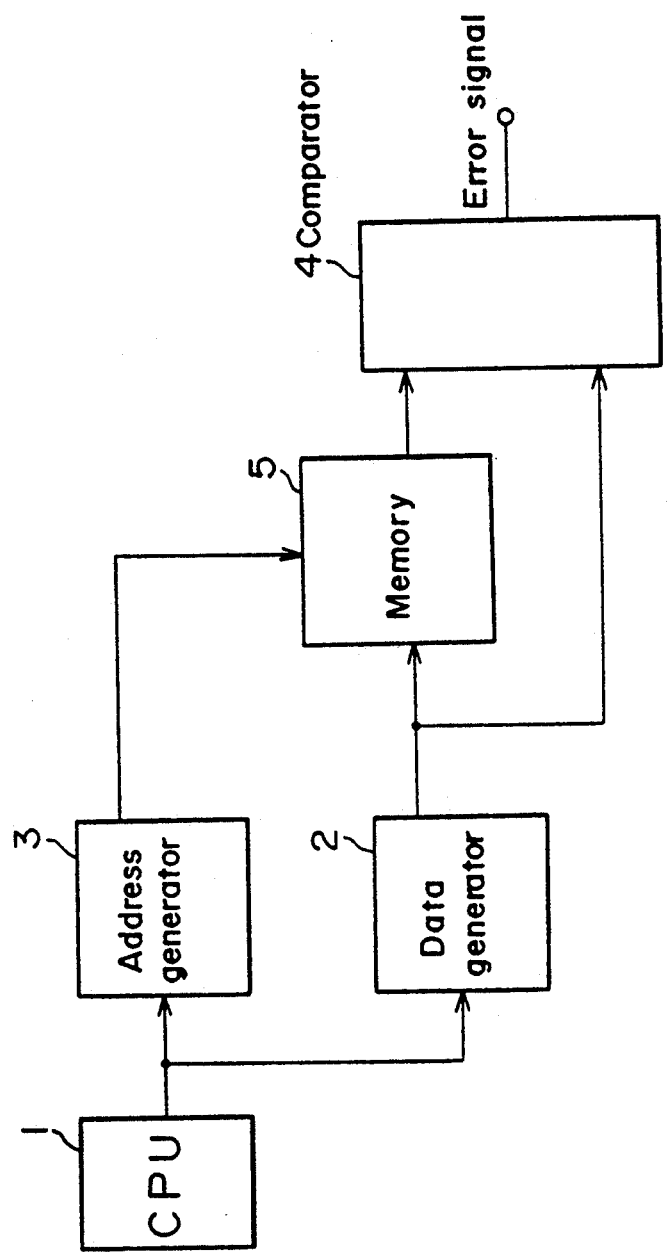
FIG. 6 is a flow diagram illustrating the construction of a conventional semiconductor memory diagnostic system.

The construction of a memory self-diagnostic system embodying the invention will now be described with reference to FIG. 1. In the figure, the numeral 6 indicates a clock generator; 7, a test finish detector; 8, an S.W. circuit; and 9, an FF. The other parts are the same as used in FIG. 6.

The clock generator 6 starts with a test start signal 1c from the CPU 1.

The test finish detector 7 operates with an output clock from the clock generator 6, detects the finish of test with the address generator 3 that generates an address, and generates a stop signal to stop the operation of the clock generator 6.

The data generator 2 generates write data to be added to the memory 5 and expected data to verify if the data has been properly written into the memory 5.

The comparator 4 compares read data from the memory 5 with expected data from the data generator 2 and detects whether they are equal or coincident or not.

The FF 9 is set by an output of the comparator 4 and is reset by a test start signal 1c.

The operation of the system illustrated in FIG. 1 will now be explained. Prior to the testing of the memory 5, the conditions of the other parts shown are set. CPU 1 gives the address generator 3 a starting address within the address range to be tested with an input data 1a. Similarly, it lets the test finish detector 7 know the range of addresses to be tested with the input data 1a.

Figure 2:
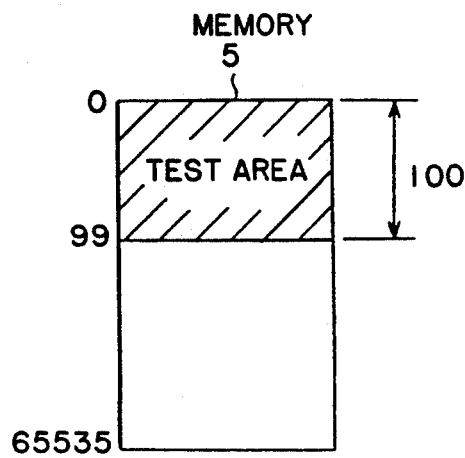
FIG. 2 is a schematic view illustrating exemplary conditions for testing a memory 5 having a capacity of 64 KW.

Now an exemplary set of conditions for testing a memory having a capacity of 64 KW will be described in conjunction with FIG. 2.

When addresses 0 to 99 out of the 64 KW are to be tested, the address generator 3 is set to "0" and the test finish detector 7 is given (99−0+1)=100. The data generator 2 gives test data via the input data 1a from the CPU 1. For example, when checking if "0" can be written to all addresses, it gives "0", and when checking if "1" can be written, it gives "1".

After the foregoing setting of conditions, a memory write mode signal 1b is sent from the CPU 1 to the S.W. circuit 8. The S.W. circuit 8 in turn outputs the output data from the data generator 2 at the output 8a for addition to the data input of the memory 5. Thus, the memory 5 is provided with the starting address from the address generator 3 and the test data from the data generator 2 through the output 8a of the S.W. circuit 8.

A test start instruction issued by the CPU 1 resets the FF 9. The instruction is also given to the clock generator 6 to start it, and the output 6b from the clock generator 6 is delivered to $\overline{WE}$ of the memory 5 with the result that the data is written into the memory. The output 6a from the clock generator is supplied as pulses to the address generator 3, data generator 2, and test finish detector 7 to change the address by +1 or −1, and change the data by +1 or −1 or retain the previous state. The cycles of 6a, 6b permit the hardware to write the test data into the memory 5. At the same time, the test finish detector 7 counts down with the output 6a until the count is "0", when it regards the test as having been finished and sends a test finish signal to the clock generator 6. Upon receipt of this signal the clock generator 6 stops generating the clock pulses. Now the test data is written to the address to be tested in the memory 5.

Next, prior to the run of the memory read mode, conditions are set. The condition setting is the same as that done before the memory write mode.

Following the condition setting, the CPU 1 outputs a memory write signal 1b as "0", and the S.W. circuit 8 is shifted to the output 8b to transmit the output from the data generator 2 as expected data to the comparator 4.

As a test start instruction 1c is issued by the CPU 1, the FF 9 is reset and the clock generator 6 started. The clock generator 6 outputs clock pulses 6a and 6b, but since the output 1b of the CPU 1 remains "0", the $\overline{WE}$ of the memory 5 is always supplied with "1". Thus, because the memory 5 is in the read cycle, the data is read out of the memory 5 by the output address of the address generator 3 and supplied to the comparator 4. The comparator 4 compares the read data from the memory 5 with the output 8b from the S.W. circuit 8 to detect whether they are equal or coincident or not. When they are not in coincidence, the comparator 4 outputs a non-coincidence signal 4a, which is given to a set input of the FF 9 to set it so as to output an error signal 10.

Since the clock generator 6 generates clock pulses 6a simultaneously with the writing in the memory, the address generator 3 and the data generator 2 also output the same address and data, respectively, as when writing in the memory.

Figure 3:
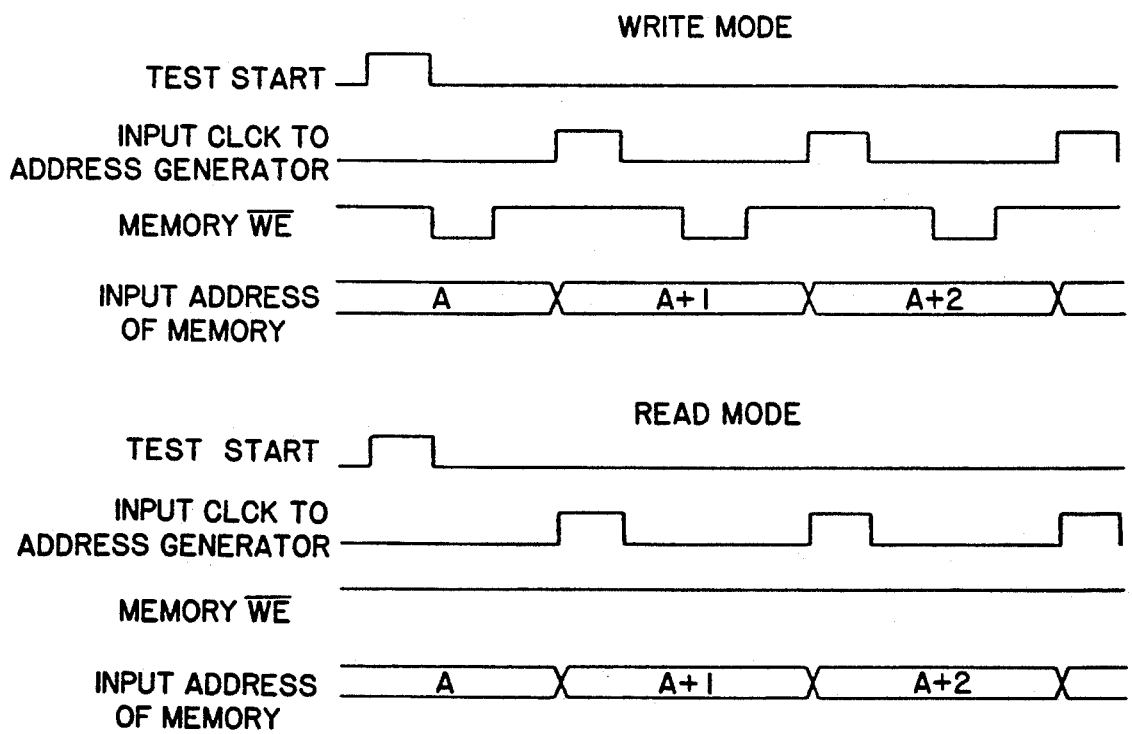
FIG. 3 is a testing time chart.

In FIG. 3 is shown a time chart in which the test timing is represented in both write and read modes.

As stated, the memory diagnostic system according to the present invention makes possible the self-diagnosis with the clock generator 6 in the cycle of its outputs 6a and 6b.

Now the circuit diagram of the embodiment shown in FIG. 1 will be described with reference to FIG. 4.

Input data 11 is connected to data inputs of up counters 2, 3 and of a down counter 7a, and the output of the up counter 3 to the address input of the memory 5. Test mode 15 is connected to the up counter 2, and the signal switches the up counter 2 over to an up count or data hold mode. The output of the up counter is connected to the S.W. circuit 8.

Write mode 12 is connected to the S.W. circuit 8, and, when it is "1", the S.W. circuit 8 is connected to the input data of the memory 5 and, when "0", the circuit 8 is connected to the comparator 4.

The write mode 12 is also connected to the input of a NAND gate 20 to control the memory 5 to be either in the write cycle or read cycle.

A test start signal 13 is connected to the reset input of the FF 9 and also to the clock generator 6.

The output 6a of the clock generator 6 is connected to the clock inputs of the up counters 2, 3 and the down counter 7a, while the output 6b is connected to the input of the NAND gate 20.

The output of the NAND gate 20 is connected to the input $\overline{WE}$ of the memory 5, and the output data of the memory 5 to the input of the comparator 4. The output of the comparator 4 is connected to the set input of the FF 9, and the output of the FF 9 to an AND gate 22 and also to an external terminal. The FF 9 is set only when an error occurs.

The output of the down counter 7a is connected to a zero coincidence detector 7b, which detects that the output of the down counter 7a becomes "0" and in that case is connected to an OR gate 21.

An error stop mode 14 is connected to the AND gate 22, and the output of the AND gate 22 is connected to the OR gate 21 whose output, in turn, is connected to the clock generator 6.

The OR gate 21 ORs the output of the zero coincidence detector 7b and the output of the AND gate; when either signal is "1", the gate outputs the signal to the clock generator 6 and brings the test to a stop.

When the error stop mode 14 is "1", the AND gate 22 outputs the error data from the FF 9 to the OR gate 21.

Thus, when it is desired to finish the test upon the detection of the first error, the error stop mode 14 is preset to "1". Then the first error will cause the clock generator 6 to stop, discontinuing its outputs 6a and 6b. Here the operator can detect which address is erroneous by reading the value of the up counter 3.

Also, inspection of the FF 9 after the testing over the whole address area enables the operator to locate the memory 5 and bits in error.

An IC tester usually has multi-bit data in the test pattern memory. In this case it is only necessary to provide as many comparators 4 and FFs 9 as the bits used plus one more OR date 23. While the data generator 2 may have the same number of outputs as the bits, one output for a single bit is enough when the same data is to be written.

Figure 4:
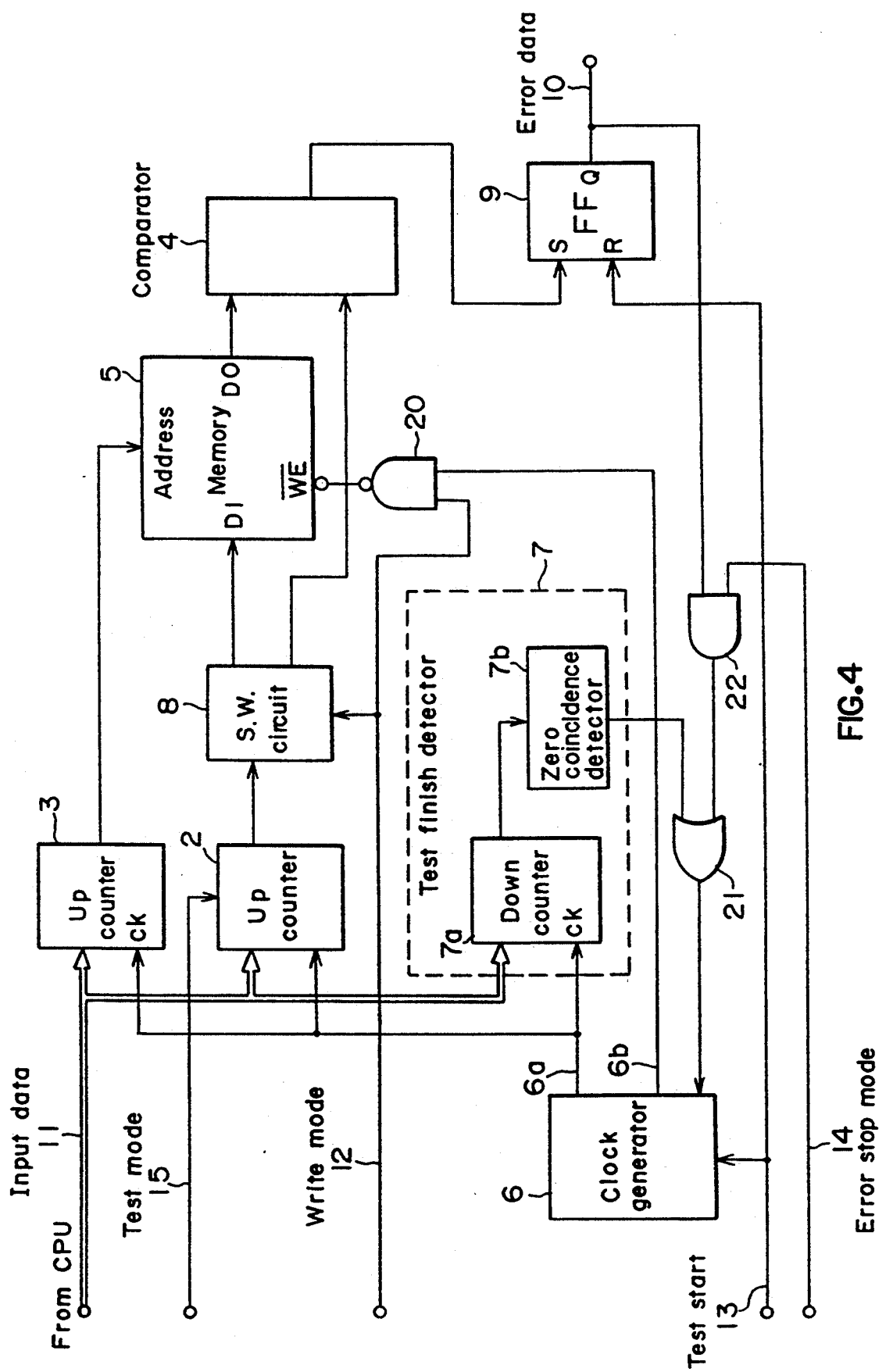
FIG. 4 is a circuit diagram of the embodiment shown in FIG. 1.
Figure 5:
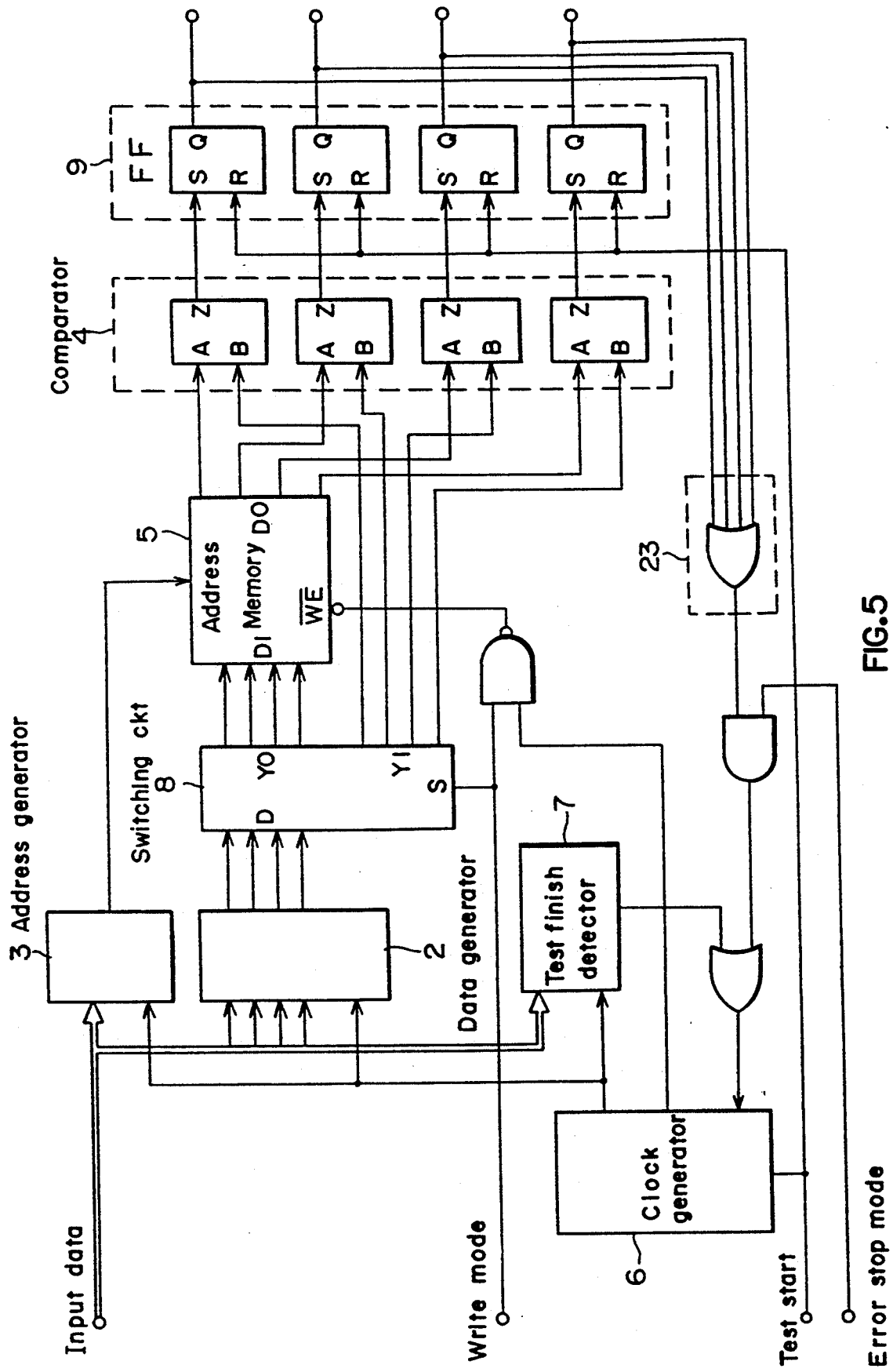
FIG. 5 is a circuit diagram of another embodiment which is similar to the embodiment of FIG. 4 but is for a 4-bit arrangement.

FIG. 5 is a circuit diagram of another embodiment in which the system of FIG. 4 is modified for four bits.

According to the present invention, the system includes a clock generator, address-generating counter, data-generating counter, test finish detector, comparator, and error bit register. As compared with conventional systems that check their memory with a CPU program, the present system can check the memory by the hardware, with the clock frequency of a clock generator, thus greatly shortening the check time required.

What is claimed:

1. A self-diagnostic system for semiconductor memory comprising:
- a CPU (1) in which a sequence program for diagnosis is written;
- a data generator (2) connected to the CPU (1) for generating data to be applied to a data input of a memory (5) to be tested when the CPU (1) is in a memory write mode and generating expected data when the CPU is in a memory read mode;
- an address generator (3) connected to the CPU (1) for giving an address to be written in the memory (5) to an address input of the memory when the CPU (1) is in the memory write mode and giving an address to be read out from the memory (5) to the address input of the memory when the CPU is in the memory read mode;
- a clock generator (6) connected to said CPU (1) and which is started with a test start signal (1c) from the CPU (1) for giving an enabling timing clock to said address generator, said data generator and said memory;
- a test finish detector (7) connected to said CPU (1) and said clock generator (6) and including means for setting in response to a signal from said CPU (1) a range of addresses in the memory (5) to be tested and means for counting the number of said addresses with said timing clock from the clock generator (6) to detect the finish of a test with the address generator (3) and stopping the operation of the clock generator (6);
- a switch circuit (8) connected to said data generator (2) and controlled by the CPU (1) for selectively connecting data from the data generator (2) to a first output (8a) connected to the data input of the memory (5) when the CPU (1) is in the memory write mode and to a second output (8b) when the CPU (1) is in the memory read mode;
- a comparator (4) connected to the output of the memory (5) for comparing the data read from the memory (5) as a first input and the expected data from the second output (8b) of the switch circuit (8) as a second input to give an output representative of whether the expected data and the data read from the memory (5) are in coincidence; and
- a flip-flop (9) which takes the output from the comparator (4) as a set signal and the test start signal (1c) from the CPU (1) as a reset signal to give an output for indicating the result of the comparison in the comparator (4).

* * * * *